United States Patent
Kim

(10) Patent No.: US 12,085,998 B2
(45) Date of Patent: Sep. 10, 2024

(54) ELECTRONIC DEVICE FOR REINFORCING STRENGTH AND INHIBITING BENDING OF METAL SEGMENTS

(71) Applicant: Samsung Electronics Co., Ltd., Gyeonggi-do (KR)

(72) Inventor: Seonghyeon Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 210 days.

(21) Appl. No.: 17/830,876

(22) Filed: Jun. 2, 2022

(65) Prior Publication Data

US 2022/0390991 A1  Dec. 8, 2022

Related U.S. Application Data

(63) Continuation of application No. PCT/KR2022/005281, filed on Apr. 12, 2022.

(30) Foreign Application Priority Data

Jun. 7, 2021  (KR) ........................ 10-2021-0073251

(51) Int. Cl.
  *G06F 1/18*    (2006.01)
  *G06F 1/20*    (2006.01)
  *H01Q 1/38*    (2006.01)

(52) U.S. Cl.
  CPC .............. *G06F 1/183* (2013.01); *G06F 1/181* (2013.01); *G06F 1/189* (2013.01); *G06F 1/203* (2013.01); *H01Q 1/38* (2013.01)

(58) Field of Classification Search
  CPC .......... G06F 1/203; G06F 1/183; G06F 1/181; G06F 1/189; G06F 1/16; G06F 1/1656;
  (Continued)

(56) References Cited

U.S. PATENT DOCUMENTS 8,913,395 B2 * 12/2014 Myers ................. H04M 1/0274
                                                    174/385
9,007,748 B2 *  4/2015 Jarvis .................... G06F 1/1626
                                                    361/679.01

(Continued)

FOREIGN PATENT DOCUMENTS

CN   109246260 B   7/2020
CN   108605066 B   12/2020

(Continued)

*Primary Examiner* — Lisa Lea-Edmonds
(74) *Attorney, Agent, or Firm* — Cha & Reiter, LLC

(57) ABSTRACT

An electronic device and method of manufacturing are disclosed. The electronic device includes a first metal segment including a first engagement portion, a second metal segment including a second engagement portion, the second metal segment spaced apart from the first metal segment so as to define a slit with the first metal segment, a support insulator engaging the first and second engagement portions, the support insulator supporting the first and second metal segments, and providing insulation between the first and second metal segments, and a filler enclosing at least a portion of the support insulator, and filling at least a portion of the slit. In the method, the first and second metal segments are arranged to define a slit therebetween, a support insulator is engaged to the isolated first and second metal segments, and the slit is filled with a material enclosing at least part of the support insulator.

20 Claims, 20 Drawing Sheets

(58) Field of Classification Search
CPC ....... G06F 1/1626; G06F 1/1633; H01Q 1/38; H05K 5/00; H05K 5/0018
See application file for complete search history.

(56) References Cited

U.S. PATENT DOCUMENTS

| | | |
|---|---|---|
| 10,372,166 B2* | 8/2019 | Gable .................... H01Q 1/243 |
| 2011/0188178 A1* | 8/2011 | Myers ................... G06F 1/1656 |
| | | 361/679.01 |
| 2013/0050911 A1* | 2/2013 | Jarvis ................. H04M 1/0249 |
| | | 361/679.01 |
| 2016/0233573 A1* | 8/2016 | Son ...................... H05K 5/0017 |
| 2017/0111077 A1* | 4/2017 | Hwang ................ G06F 1/1626 |
| 2018/0017995 A1* | 1/2018 | Gable ................... B29C 70/763 |
| 2022/0390991 A1* | 12/2022 | Kim ........................ G06F 1/203 |

FOREIGN PATENT DOCUMENTS

| | | |
|---|---|---|
| KR | 10-2016-0006910 A | 1/2016 |
| KR | 10-1610611 B1 | 4/2016 |
| KR | 10-2016-0066628 A | 6/2016 |
| KR | 10-2016-0081479 A | 7/2016 |
| KR | 10-2018-0037377 A | 4/2018 |
| KR | 10-2018-0115312 A | 10/2018 |
| KR | 10-1981537 B1 | 5/2019 |
| KR | 10-2020-0092586 A | 8/2020 |

* cited by examiner

ELECTRONIC DEVICE FOR REINFORCING STRENGTH AND INHIBITING BENDING OF METAL SEGMENTS

CROSS-REFERENCE TO RELATED APPLICATIONS

This application is a continuation of International Application No. PCT/KR2022/005281 designating the United States, filed on Apr. 12, 2022, in the Korean Intellectual Property Receiving Office and claiming priority to Korean Patent Application No. 10-2021-0073251, filed on Jun. 7, 2021, in the Korean Intellectual Property Office, the disclosures of which are incorporated by reference herein in their entireties.

BACKGROUND

1. Technical Field

The disclosure relates to electronic devices, and, more particular, to using metal segments to reinforce durability and stiffness between segments of an electronic device housing.

2. Description of Related Art

Electronic devices may include a communication module and an antenna module to provide various communication-related services. For example, electronic devices may include a plurality of metal segments based on an increased number of antenna modules.

SUMMARY

Certain embodiments of the present disclosure provide an electronic device that reinforces the strength of the metal segments, and protects the metal segments from bending, by maintaining a gap between the metal segments.

According to certain example embodiments, an electronic device includes a first metal segment including a first engagement portion, a second metal segment including a second engagement portion, the second metal segment spaced apart from the first metal segment so as to define a slit with the first metal segment, a support insulator engaging the first and second engagement portions, the support insulator supporting the first and second metal segments, and providing insulation between the first and second metal segments, and a filler enclosing at least a portion of the support insulator, and filling at least a portion of the slit.

According to certain example embodiments, a method of manufacturing an electronic device includes arranging a first metal segment including a first engagement portion and a second metal segment including a second engagement portion, wherein the first metal segment is spaced apart from the second metal segment so as to define a slit therebetween, engaging a support insulator supporting the first metal segment and the second metal segment, and providing insulation between the first metal segment and the second metal segment with the first engagement portion and the second engagement portion, and forming a filler, including filling at least a portion of the slit with an injection object or material, while enclosing at least a portion of the support insulator.

According to certain embodiments of the present disclosure, the metal segments may be reinforced in strength, and the metal segments may be protected against bending, while one or more gaps are maintained between the metal segments.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
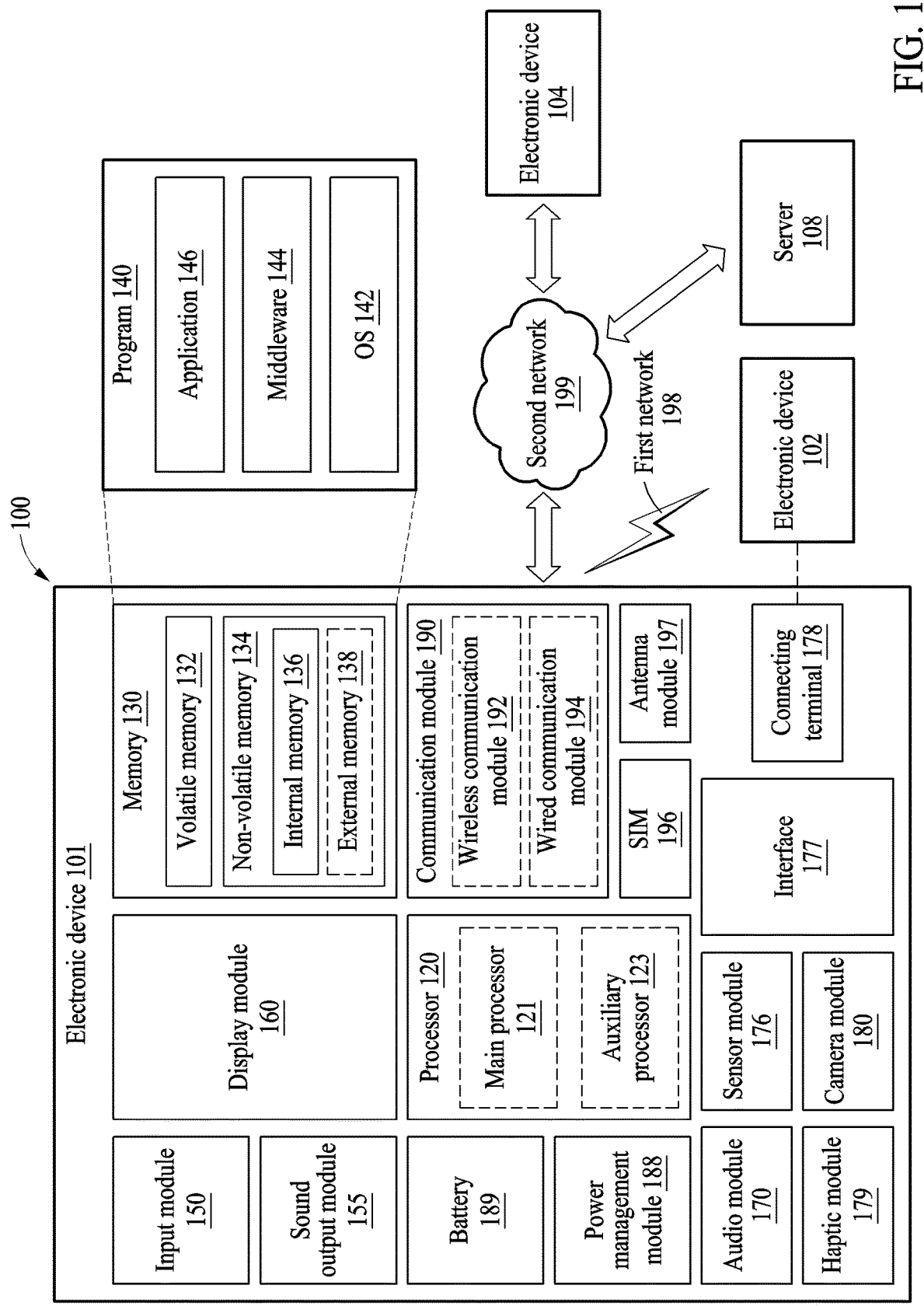
FIG. 1 is a block diagram of an electronic device in a network environment according to certain example embodiments.
Figure 2A:
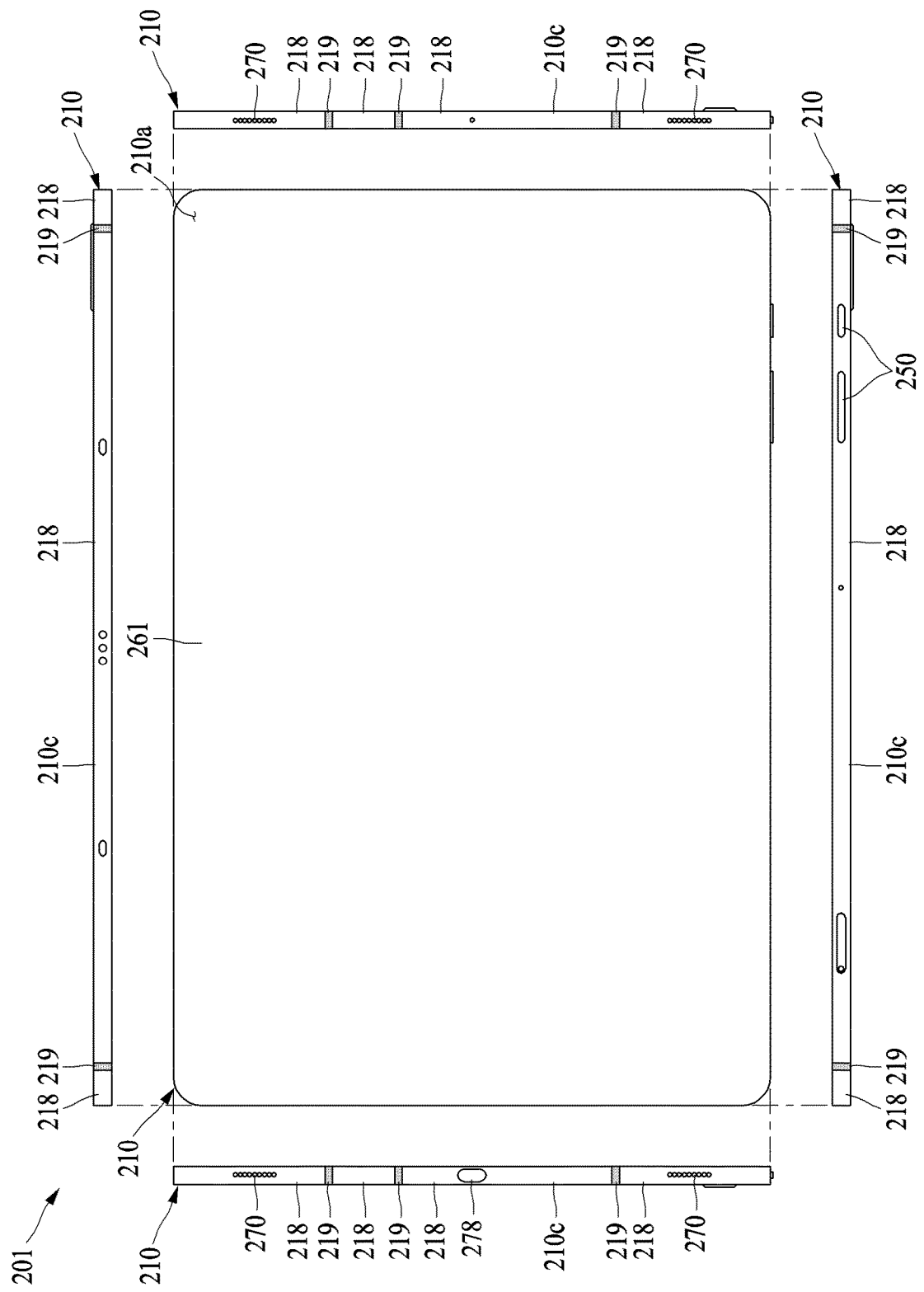
FIG. 2A is a view of a first surface (e.g., a front surface) and a second surface (e.g., a side surface) of an electronic device according to certain example embodiments.
Figure 2B:
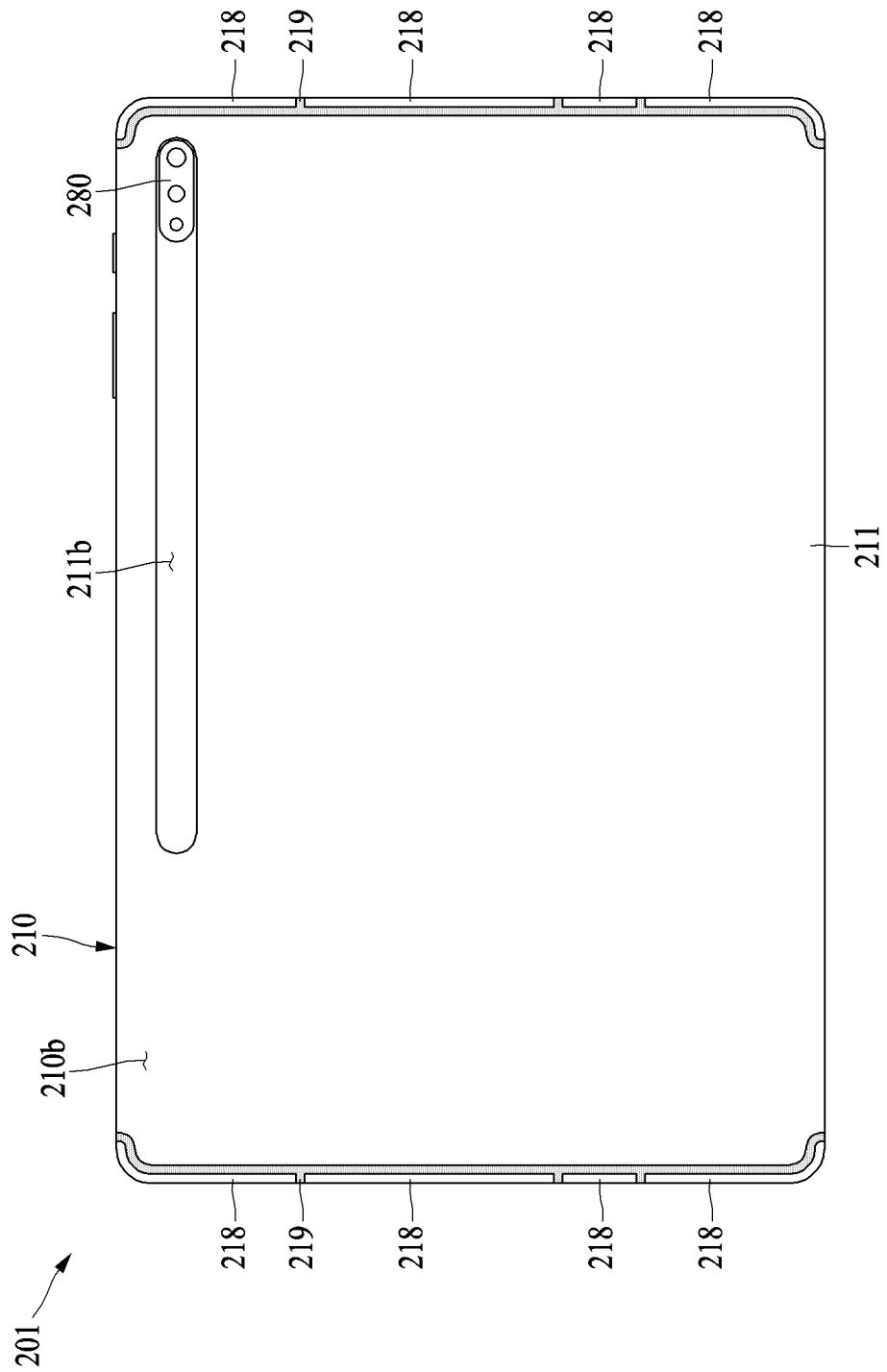
FIG. 2B is a view of a third surface (e.g., a rear surface) of the electronic device according to certain example embodiments.
Figure 2C:
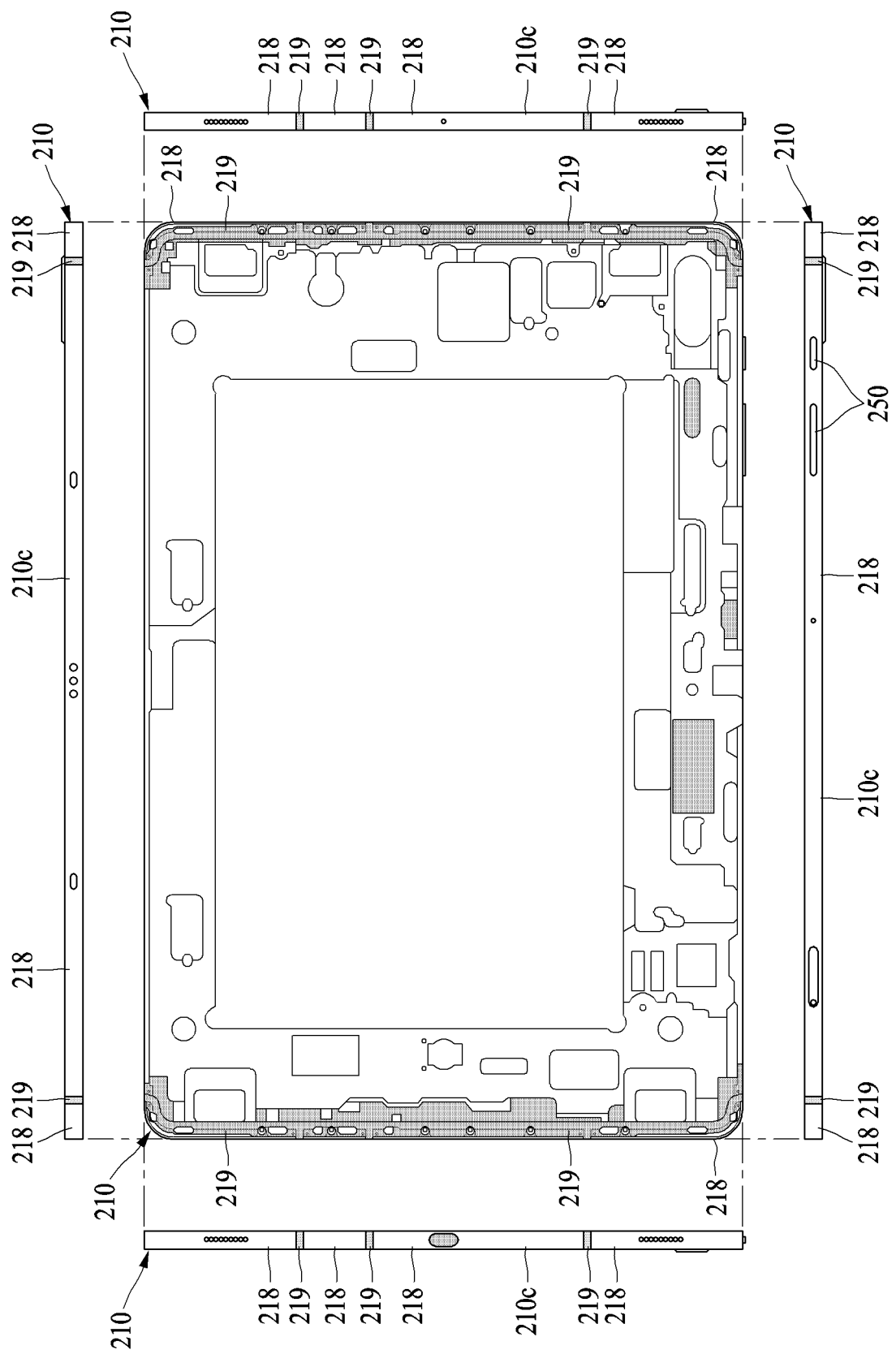
FIG. 2C is a view of an interior structure of the electronic device of FIG. 2A at the first surface of the electronic device, with the second surface.
Figure 2D:
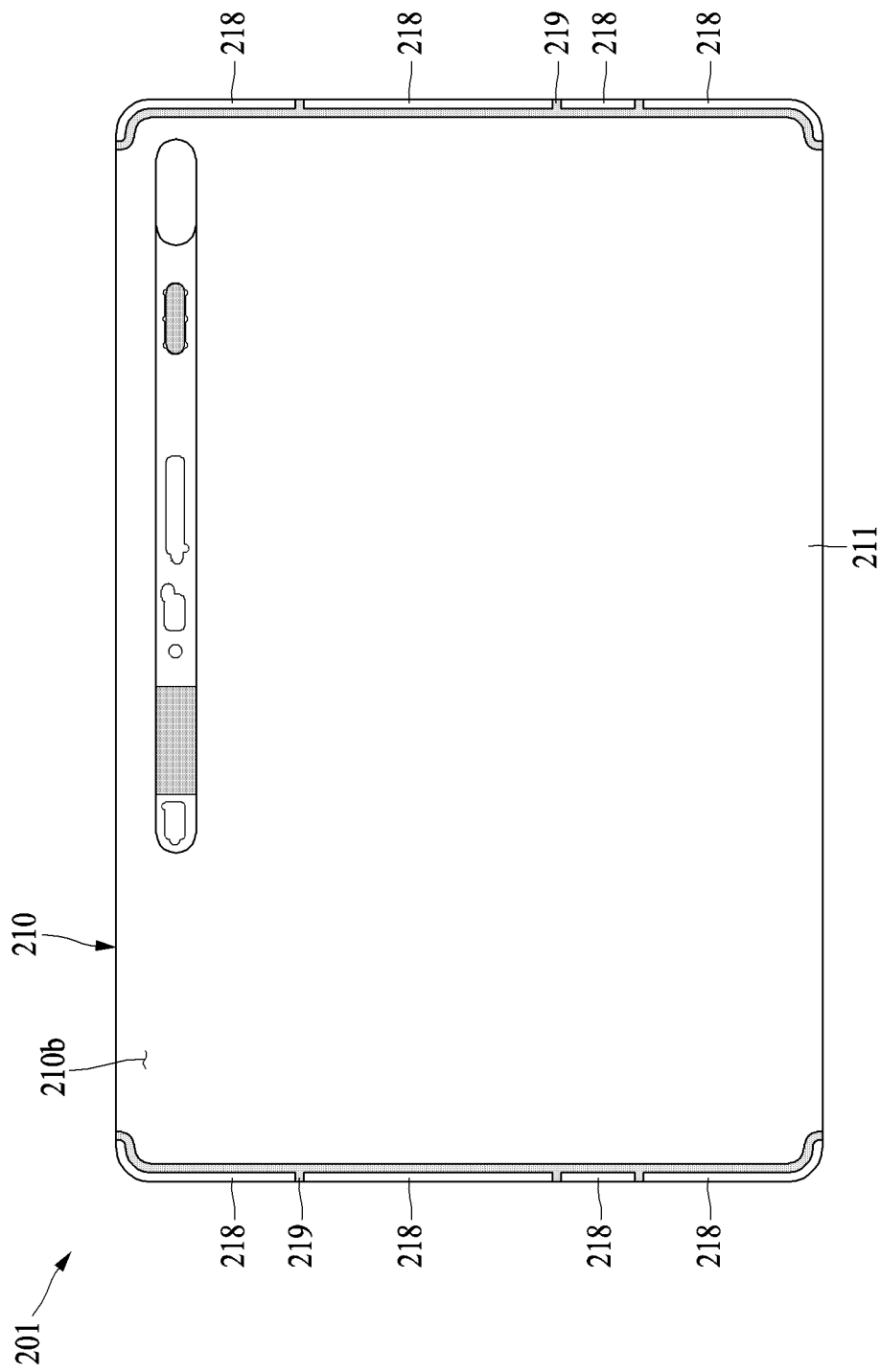
FIG. 2D is a view of an interior structure of the electronic device of FIG. 2B at the second surface.
Figure 2E:
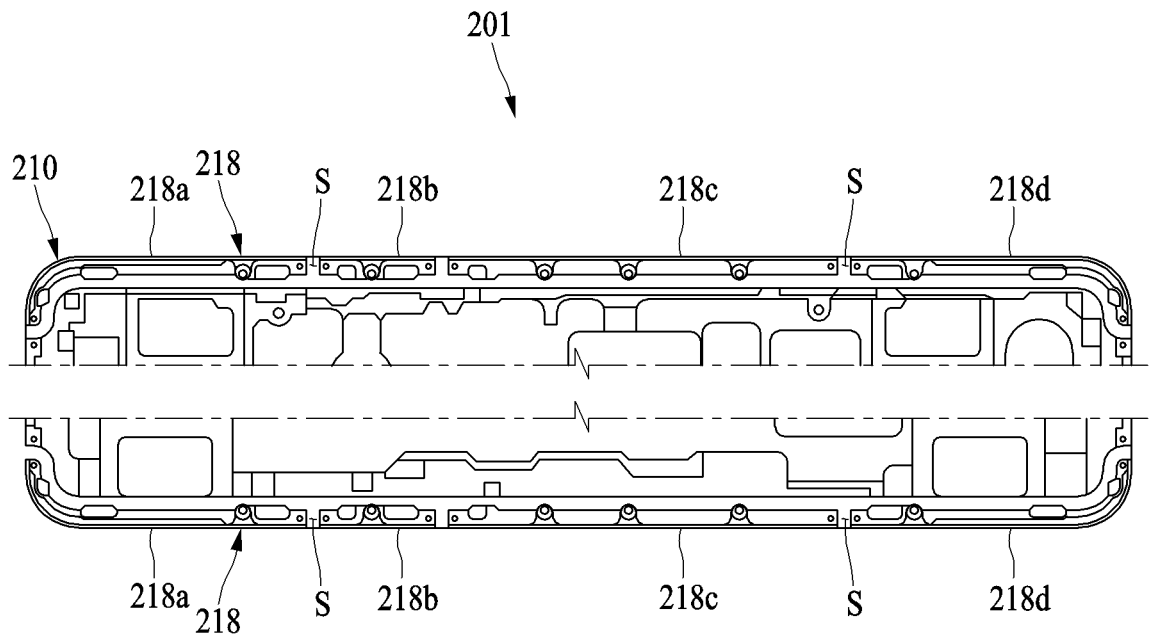
FIG. 2E is a view of metal segments excluding a region of a filler in the electronic device according to certain example embodiments.
Figure 2F:
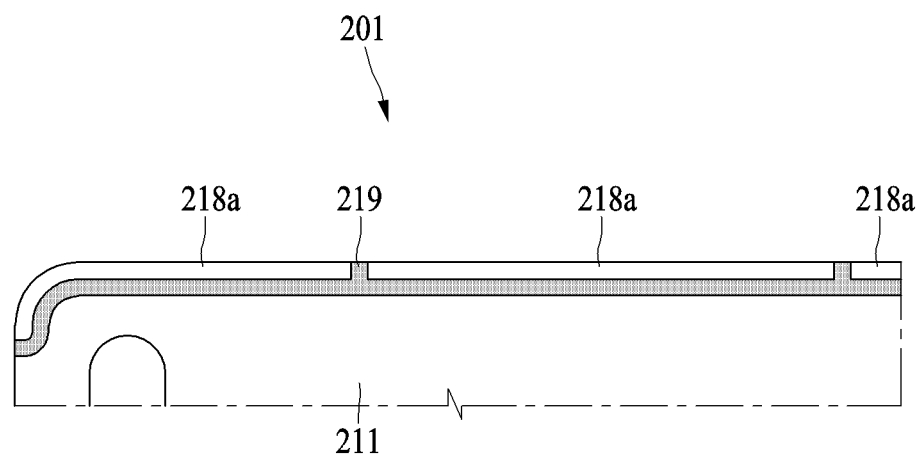
FIG. 2F is a view of metal segments including a region of a filler in the electronic device according to certain example embodiments.
Figure 2G:
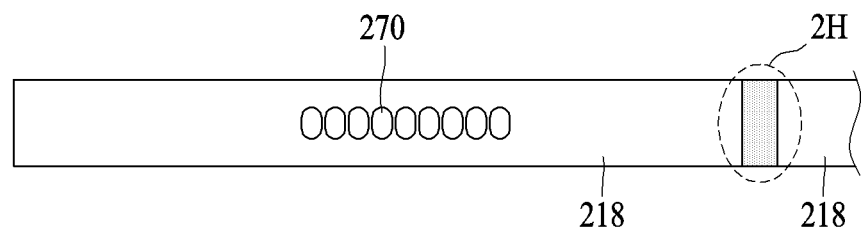
FIG. 2G is a view of a portion of the second surface of the electronic device according to certain example embodiments.
Figure 2H:
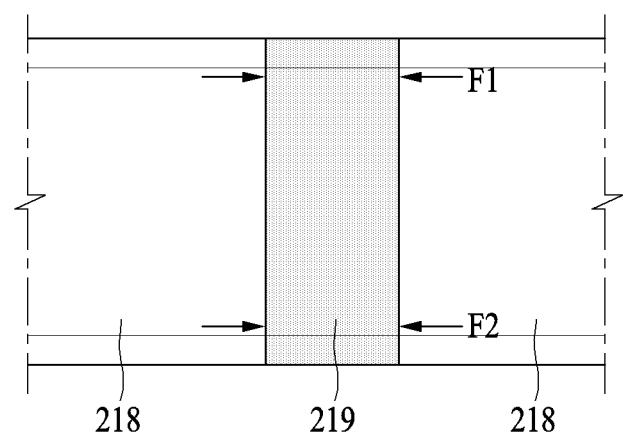
FIG. 2H is an enlarged view of 2H of the electronic device of FIG. 2G.

Hereinafter, certain example embodiments will be described in greater detail with reference to the accompanying drawings. When describing the example embodiments with reference to the accompanying drawings, like reference numerals refer to like elements and a repeated description related thereto will be omitted.

Referring to FIG. 1, an electronic device 101 in a network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to an example embodiment, the electronic device 101 may communicate with the electronic device 104 via the server 108. According to an example embodiment, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some example embodiments, at least one (e.g., the connecting terminal 178) of the above components may be omitted from the electronic device 101, or one or more other components may be added in the electronic device 101. In some example embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an example embodiment, as at least a part of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an example embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is in an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence (AI) model processing. An AI model may be generated by machine learning. Such learning may be performed by, for example, the electronic device 101 in which an artificial intelligence model is executed, or performed via a separate server (e.g., the server 108). Learning algorithms may include, but are not limited to, for example, supervised learning, unsupervised learning, semi-supervised learning, or reinforcement learning. The artificial intelligence model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The AI model may additionally or alternatively include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 and an external memory 138.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to an example embodiment, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to an example embodiment, the display device 160 may include a touch sensor adapted to sense a touch, or a pressure sensor adapted to measure an intensity of a force incurred by the touch.

The audio module 170 may convert a sound into an electric signal or vice versa. According to an example embodiment, the audio module 170 may obtain the sound via the input device 150 or output the sound via the sound output device 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electric signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an example embodiment, the connecting terminal 178 may include, for example, an HDMI connector, a USB connector, an SD card connector, or an audio connector (e.g., a headphone connector).

The haptic module 179 may convert an electric signal into a mechanical stimulus (e.g., a vibration or a movement) or an electrical stimulus which may be recognized by a user via his or her tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, ISPs, or flashes.

The power management module 188 may manage power supplied to the electronic device 101. According to an example embodiment, the power management module 188 may be implemented as, for example, at least a part of a power management integrated circuit (PMIC).

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an example embodiment, the antenna module 197 may include an antenna including a radiating element including a conductive material or a conductive pattern formed in or on a substrate (e.g., a printed circuit board (PCB)). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to an example embodiment, another component (e.g., a radio frequency integrated circuit (RFIC)) other than the radiating element may be additionally formed as a part of the antenna module 197.

According to certain example embodiments, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or received between the electronic device 101 and the external electronic device 104 via the server 108 coupled with the second network 199. Each of the external electronic devices 102 or 104 may be a device of the same type as or a different type from the electronic device 101. According to an example embodiment, all or some of operations to be executed by the electronic device 101 may be executed at one or more of the external electronic devices 102, 104, and 108. For example, if the electronic device 101 needs to perform a function or a service automatically, or in response to a request from a user or another device, the electronic device 101, instead of, or in addition to, executing the function or the service, may request one or more external electronic devices to perform at least part of the function or the service. The one or more external electronic devices receiving the request may perform the at least part of the function or the service requested, or an additional function or an additional service related to the request, and may transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another example embodiment, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to certain example embodiments may be one of various types of electronic devices. The electronic device may include, for example, a portable communication device (e.g., a smartphone), a computer device, a portable multimedia device, a portable medical device, a camera, a wearable device, or a home appliance device. According to an example embodiment of the disclosure, the electronic device is not limited to those described above.

It should be appreciated that certain example embodiments of the present disclosure and the terms used therein are not intended to limit the technological features set forth herein to particular embodiments and include various changes, equivalents, or replacements for a corresponding embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and may refer to components in other aspects (e.g., importance or order) is not limited. It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with certain example embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an example embodiment, the module may be implemented in a form of an application-specific integrated circuit (ASIC).

Certain example embodiments as set forth herein may be implemented as software (e.g., the program 140) including one or more instructions that are stored in a storage medium (e.g., an internal memory 136 or an external memory 138) that is readable by a machine (e.g., the electronic device 101) For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an example embodiment, a method according to certain example embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain example embodiments, each component (e.g., a module or a program) of the above-described components may include a single entity or multiple entities, and some of the multiple entities may be separately disposed in different components. According to certain example embodiments, one or more of the above-described components may be omitted, or one or more other components may be added. Alternatively or additionally, a plurality of components (e.g., modules or programs) may be integrated into a single component. In such a case, according to certain example embodiments, the integrated component may still perform one or more functions of each of the plurality of components in the same or similar manner as they are performed by a corresponding one of the plurality of components before the integration. According to certain example embodiments, operations performed by the module, the program, or another component may be carried out sequentially, in parallel, repeatedly, or heuristically, or one or more of the operations may be executed in a different order or omitted, or one or more other operations may be added.

Referring to FIGS. 2A to 2H, an electronic device 201 (e.g., the electronic device 101 of FIG. 1) according to an example embodiment may include a housing 210 including a first surface 210*a* (e.g., a front surface), a second surface 210*b* (e.g., a rear surface), and a plurality of third surfaces 210*c* (e.g., a side surface) enclosing a space defined between the first surface 210*a* and the second surface 210*b*.

In an example embodiment, the first surface 210*a* may be substantially formed by a display 261 (e.g., the display module 160). Edges of the display 261 may be connected to the plurality of third surfaces 210*c*. In another example embodiment, the first surface 210*a* may be formed via a plate, which is substantially transparent, which may occupy a space disposed between the display 261 and the plurality of third surfaces 210*c*. For example, the plate may include a glass plate, which itself may include various coating layers, a polymer plate, and an arbitrary plate according to any suitable structure.

In an example embodiment, the second surface 210*b* may be formed of a plate 211, which may be substantially opaque. For example, the plate 211 may be formed of coated or tinted glass, ceramic, polymer, metal (e.g., aluminum, stainless steel (STS), or magnesium), and/or a combination of at least two thereof.

In an example embodiment, the plurality of third surfaces 210*c* may be combined with the plate 211. In an example embodiment, the plurality of third surfaces 210*c* may be formed of at least a portion of a plurality of metal members 218 (e.g., metal segments) that are spaced apart from each other, and at least a portion of at least one non-metallic member 219 (e.g., a filler) disposed between a pair of the adjacent metal members 218. In an example embodiment, at least the portion of the plurality of metal members 218 and at least one non-metallic member 219 may form at least a portion of the second surface 210*b*. In an example embodiment, at least one of the plurality of metal members 218 may function as an antenna.

In an example embodiment, the electronic device 201 may include an input module 250 (e.g., the input module 150), an audio module 270 (e.g., the audio module 170), a sensor module (e.g., the sensor module 176), a camera module 280 (e.g., the camera module 180), a connecting terminal 278 (e.g., the connecting terminal 178), and/or other components (e.g., the processor 120, the memory 130, the sound output module 155, the audio module 170, the interface 177, the haptic module 179, the power management module 188, the battery 189, the communication module 190, the SIM 196, and/or the antenna module 197).

In an example embodiment, the audio module 270 may be formed on at least one of the metal members 218. In an example embodiment, the camera module 280 may be disposed on the plate 211. In an example embodiment, the camera module 280 may be visually exposed to an exterior environment through at least a portion of a recessed region 211*b* formed in the plate 211. In an example embodiment, the connecting terminal 278 may be formed on at least one of the metal members 218.

In an example embodiment, the plate 211 and the plurality of metal members 218 may form a slit "S," and may be spaced apart from each other. For example, the plurality of metal members 218 may include a first metal segment 218*a*, a second metal segment 218*b*, a third metal segment 218*c*, and a fourth metal segment 218*d*, and one or more of the plurality of metal segments 218*a*, 218*b*, 218*c*, and 218*d* may function as an antenna which may operate at a predetermined resonant frequency.

In an example embodiment, at least one of the non-metallic members 219 may couple the plate 211 and the plurality of metal members 218 via bonding, and may also bond a pair of the adjacent metal members 218. For example, when manufacturing the electronic device 201, the non-metallic member 219 may be injection-filled into at least a portion of the slit S, and after a predetermined time has elapsed (e.g., for curing), may serve to connect the pair of adjacent metal members 218. In an example embodiment, at least one of the non-metallic members 219 may extend across a first region and a second region of the third surface 210*c*. In an example embodiment, at least one of the non-metallic members 219 may form at least a portion of an exterior of the electronic device 201, and may be formed of a material (e.g., resin) that provides a suitable color and texture for the aesthetics of the exterior of the electronic device 201.

In an example embodiment, a structure (e.g., FIG. 2H), including the pair of adjacent metal members 218 and the non-metallic member 219, may bond the pair of adjacent metal members 218 by contraction of the non-metallic member 219 or pressing due to external force. The pair of adjacent metal members 218 may apply first stress or a first force F1 to a first region (e.g., an upper region in FIG. 2H) of the non-metallic member 219, and may apply second stress or a second force F2, which may be different from the first stress or the first force F1, to a second region (e.g., a lower region in FIG. 2H), which is different from the first region, of the non-metallic member 219. The non-metallic member 219 may improve the stiffness of the pair of adjacent metal members 218, inhibiting or impeding bending of the pair of adjacent metal members 218, that may occur as a size (e.g., a size in a horizontal direction) of the second region (e.g., the lower region) becomes smaller than a size (e.g., a size in a horizontal direction) of the first region (e.g., the upper region).

Referring to FIGS. 3A to 3E, an electronic device 301 (e.g., the electronic device 201) may include a housing 310 (e.g., the housing 210) including a first surface (e.g., the first surface 210*a*), a second surface 310*b* (e.g., the second surface 210*b*), and a plurality of third surfaces 310*c* (e.g., the third surface 210*c*). The second surface 310*b* may include a plate 311 (e.g., the plate 211). The electronic device 301 may include a plurality of metal segments 318*a*, 318*b*, 318*c*, and 318*d* (e.g., the plurality of metal segments 218*a* to 218*d*) formed on at least a portion of the second surface 310*b* and at least a portion of the plurality of the third surfaces 310*c*, a filler 319 (e.g., the non-metallic member 219) filling at least a portion of a slit S between pairs of adjacent metal segments 318*a* and 318*b*, 318*b* and 318*c*, and 318*c* and 318*d*, and a slit (e.g., the slit S of FIG. 2E) between the plurality of metal segments 318*a* to 318*d* and the plate 311, and a support insulator 321.

Figure 3A:
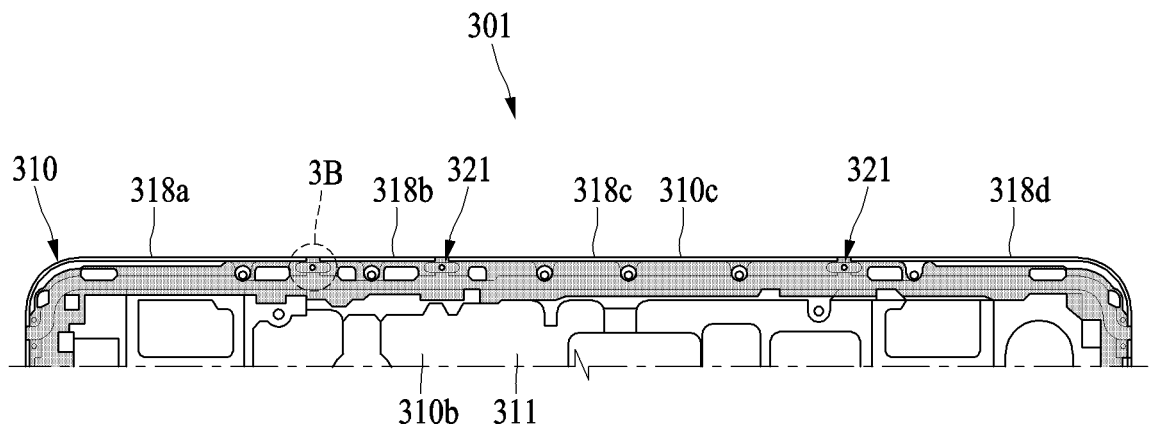
FIG. 3A is a view of an interior structure of an electronic device including metal segments according to certain example embodiments.
Figure 3B:
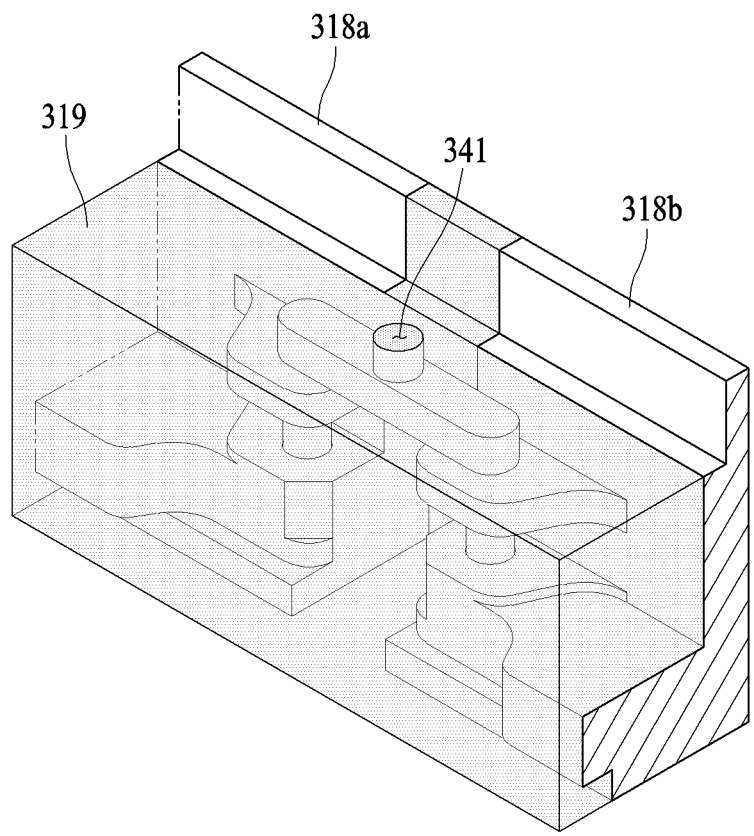
FIG. 3B is an enlarged view of 3B of the electronic device of FIG. 3A.
Figure 3C:
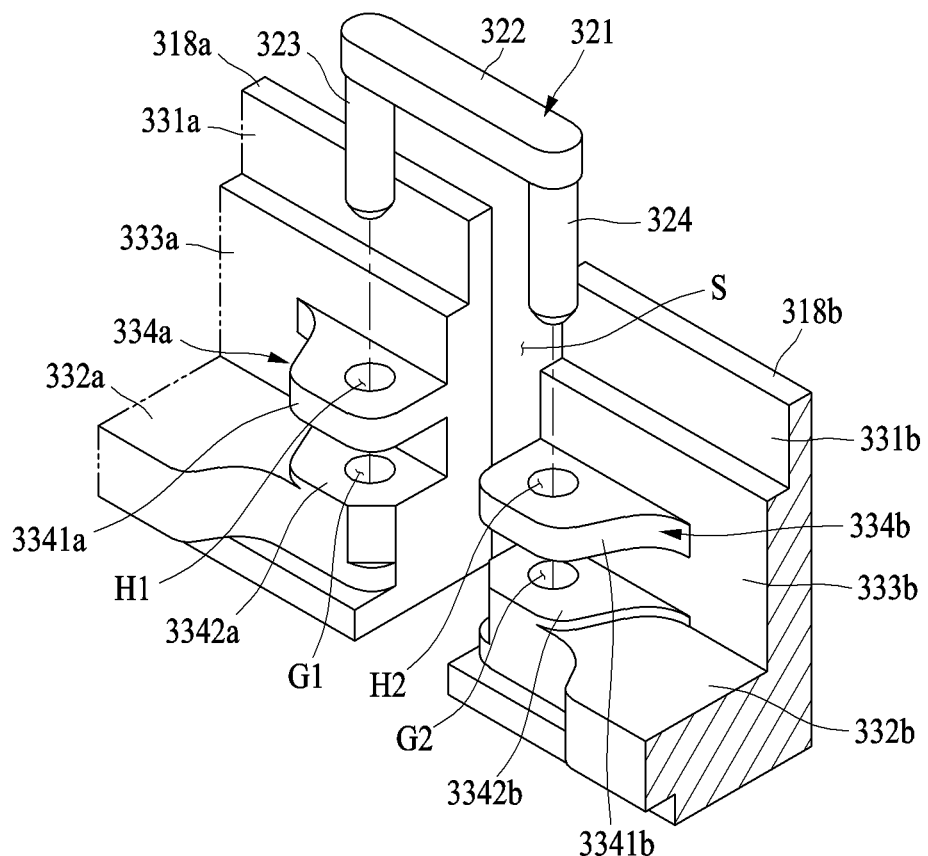
FIG. 3C is an exploded perspective view illustrating an engagement structure of a pair of adjacent metal segments in the electronic device of FIG. 3A.
Figure 3D:
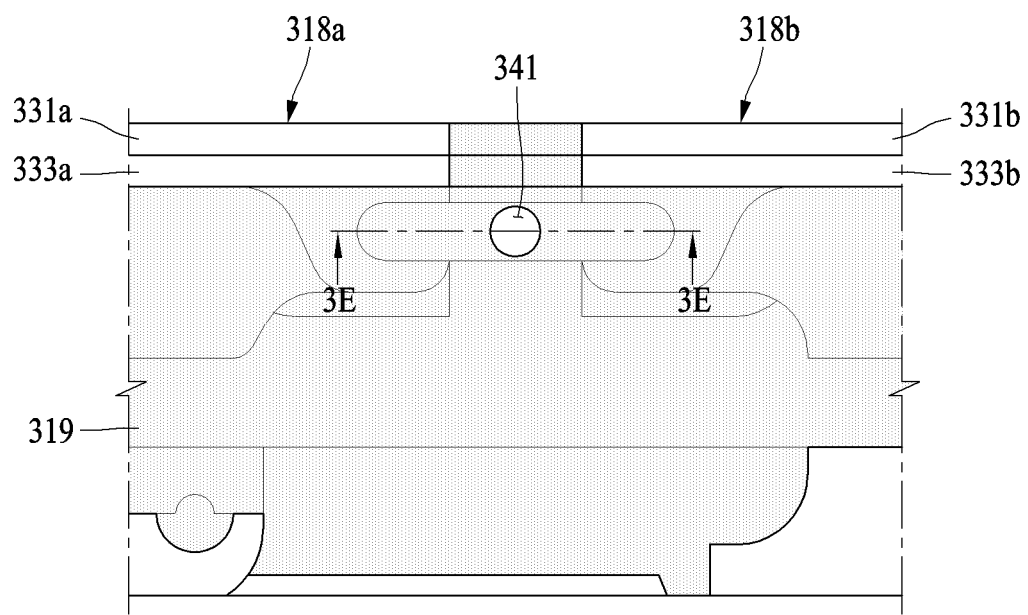
FIG. 3D is a plan view of the electronic device of FIG. 3B.
Figure 3E:
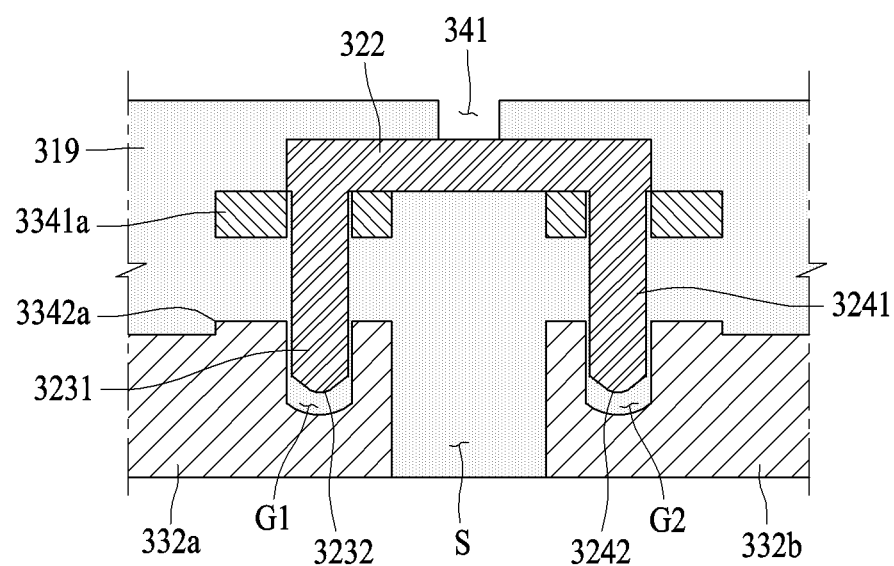
FIG. 3E is a cross-sectional view of the electronic device of FIG. 3D, taken along 3E-3E.

In an example embodiment, the first metal segment 318*a* may include a first wall 331*a* forming at least a portion of the third surface 310*c*, a first sheet 332*a* forming at least a portion of the second surface 310*b*, and a second wall 333*a* disposed between the first wall 331*a* and the first sheet 332*a*. In an example embodiment, a height of the first wall 331*a* with respect to the first sheet 332*a* may be greater than a height of the second wall 333*a* with respect to the first sheet 332*a*. In an example embodiment, a step may be formed between the first wall 331*a* and the second wall 333*a*, as seen in FIG. 3C.

In an example embodiment, the second metal segment 318*b* may include a third wall 331*b* forming at least a portion of the third surface 310*c*, a second sheet 332*b* forming at least a portion of the second surface 310*b*, and a fourth wall 333*b* formed between the third wall 331*b* and the second sheet 332*b*. In an example embodiment, a height of the third wall 331*b* with respect to the second sheet 332*b* may be greater than a height of the fourth wall 333*b* with respect to the second sheet 332*b*. In an example embodiment, a step may be formed between the third wall 331*b* and the fourth wall 333*b*, as seen in FIG. 3C.

In an example embodiment, the first metal segment 318*a* may include a first engagement portion 334*a*. The first engagement portion 334*a* may be engaged with at least a portion (e.g., a first link 323) of the support insulator 321.

In an example embodiment, the first engagement portion 334*a* may include a first metal support layer 3341*a* formed on the second wall 333*a*. The first metal support layer 3341*a* may be configured to support at least a portion of the support insulator 321 (e.g., a base 322). The first metal support layer 3341*a* may include a first hole H1.

In an example embodiment, the first engagement portion 334*a* may include a plurality of first metal support layers 3341*a* and 3342*a*, spaced apart from each other along the second wall 333*a*. The first metal support layer 3341*a* (which may include any of the plurality of first metal support layers 3341*a* and 3342*a*) may be formed on the second wall 333*a*, and the other first metal support layer 3342*a* may be formed on the first sheet 332*a* and the second wall 333*a*. In an example embodiment, the first metal support layer 3342*a* may be disposed on a different surface than the first sheet 332*a*. The first metal support layer 3342*a* may include a first groove G1. In another example embodiment, the first groove G1 may be formed in the first sheet 332*a*, without the first metal support layer 3342*a*.

In an example embodiment, the second engagement portion 334*b* may include a second metal support layer 3341*b* formed on the fourth wall 333*b*. The second metal support layer 3341*b* may be configured to support at least a portion of the support insulator 321 (e.g., the base 322). The second metal support layer 3341*b* may include a second hole H2.

In an example embodiment, the second engagement portion 334*b* may include a plurality of second metal support layers 3341*b* and 3342*b*, spaced apart from each other along the fourth wall 333*b*. The second metal support layer 3341*b* (which may include any of the plurality of second metal support layers 3341*b* and 3342*b*) may be formed on the fourth wall 333*b*, and the other second metal support layer 3342*b* may be formed on the second sheet 322*b* and the fourth wall 333*b*. In an example embodiment, the second metal support layer 3342*b* may be disposed on a different surface than the second sheet 332*b*. The second metal support layer 3342*b* may include a second groove G2. In another example embodiment, the second groove G2 may be formed in the second sheet 332*b*, without the second metal support layer 3342*b*.

The support insulator 321 may (e.g., via multiple instances of the support insulator 321) engage with pairs of adjacent metal segments 318*a* and 318*b*, 318*b* and 318*c*, and 318*c* and 318*d*, support the pairs of adjacent metal segments 318*a* and 318*b*, 318*b* and 318*c*, and 318*c* and 318*d*, and provide insulation between each of the pairs of adjacent metal segments 318*a* and 318*b*, 318*b* and 318*c*, and 318*c* and 318*d*. The support insulator 321 may improve warping stiffness and bending stiffness between the pairs of adjacent metal segments 318*a* and 318*b*, 318*b* and 318*c*, and 318*c* and 318*d*, by inhibiting or impeding bending, which may occur when stress or force is applied to different portions of the filler 319 by the pairs of adjacent metal segments 318*a* and 318*b*, 318*b* and 318*c*, and 318*c* and 318*d*, with the filler 319, while maintaining a constant interval between the pairs of adjacent metal segments 318*a* and 318*b*, 318*b* and 318*c*, 318*c* and 318*d*.

In an example embodiment, the support insulator 321 may include the base 322, the first link 323 extending from a portion (e.g., a lower left portion with reference to FIG. 3E) of the base 322, and a second link 324 extending from an opposite portion (e.g., a lower right portion with reference to FIG. 3E) of the base 322.

The base 322 may connect the first link 323 to the second link 324. When engaging with the support insulator 321, the base 322 may be supported by the first metal support layer 3341*a* and/or the second metal support layer 3341*b*.

The first link 323 may be inserted so as to pass through the first hole H1. In an example embodiment, movement of the first link 323 may be substantially limited in a direction (e.g., a horizontal direction with reference to FIG. 3E) by insertion into the first hole H1. In an example embodiment, at least a portion (e.g., an end portion) of the first link 323 may be accommodated in the first groove G1. In an example embodiment, movement of the first link 323 may be substantially limited in a particular direction (e.g., a horizontal direction with reference to FIG. 3E) by seating within the first groove G1.

In an example embodiment, the first link 323 may include a first extension 3231 extending from a first portion (e.g., a lower left portion with reference to FIG. 3E) of the base 322 and passing through the first hole H1, and a first receiving end 3232 formed at an end portion of the first extension 3231 and seated within the first groove G1. In an example embodiment, the first extension 3231 may include a cross-section in a shape (e.g., a circle) substantially having a constant dimension (e.g., a diameter). In an example embodiment, the first receiving end 3232 may include a tapered shape.

The second link 324 may be inserted so as to pass through the second hole H2. In an example embodiment, movement of the second link 324 may be substantially limited in a particular direction (e.g., a horizontal direction with reference to FIG. 3E) by insertion into the second hole H2. In an example embodiment, at least a portion (e.g., an end portion) of the second link 324 may be seated within the second groove G2. In an example embodiment, movement of the second link 324 may be substantially limited in a particular direction (e.g., a horizontal direction with reference to FIG. 3E) by seating within the second groove G2.

In an example embodiment, the second link 324 may include a second extension 3241 extending from a second portion (e.g., a lower right portion with reference to FIG. 3E) of the base 322 and inserted so as to pass through the second hole H2, and a second receiving end 3242 formed at an end portion of the second extension 3241 and seated within the second groove G2. In an example embodiment, the second extension 3241 may include a cross-section in a shape (e.g., a circle) substantially having a constant size (e.g., a diameter). In an example embodiment, the second receiving end 3242 may include a tapered shape.

In an example embodiment, the base 322, the first link 323, and the second link 324 may be integrally formed so as to be seamless with each other.

When engaging with the first metal segment 318a, the second metal segment 318b, and the support insulator 321, the filler 319 may enclose at least a portion of the support insulator 321 and may fill the slit S between the first metal segment 318a and the second metal segment 318b.

In an example embodiment, the filler 319 may be formed so as to possess a color, appropriate for a certain aesthetic of an exterior of the electronic device 301, and/or a material, which includes a texture appropriate for the aesthetic. For example, the filler 319 may be formed of polybutylene terephthalate (PBT). On the other hand, the filler 319 and the support insulator 321 may be formed of different materials.

In an example embodiment, the support insulator 321 may be formed of a material that has a greater stiffness than a material of the filler 319. This may improve anti-warp and anti-bending stiffness between pairs of adjacent metal segments 318a and 318b, 318b and 318c, and 318c and 318d.

In an example embodiment, the support insulator 321 may be formed of a material of which heat resistance is substantially equal to or greater than a material of the filler 319. This may substantially prevent the support insulator 321 from being contracted by an example operation (e.g., an operation of applying a color to the plate 311 and/or the plurality of metal segments 318a to 318d by heat) of manufacturing the electronic device 301, and thus, warping stiffness and bending stiffness between the pairs of adjacent metal segments 318a and 318b, 318b and 318c, and 318c and 318d may be improved.

In an example embodiment, the support insulator 321 may be formed of a material of which permittivity is substantially equal to or greater than a material of the filler 319. This may benefit the operational performance (e.g., an operation within a predetermined resonant frequency) of the first metal segment 318a, which may function as an antenna, and/or the second metal segment 318b.

In an example embodiment, the support insulator 321 may include a non-crystalline thermoplastic plastic. For example, the support insulator 321 may include polyetherimide (PEI). The support insulator 321 may have an increased deformation threshold temperature by heat (e.g., approximately greater than or equal to 200 □) via formation of the support insulator 321 using the non-crystalline thermoplastic plastic, which may improve dimensional stability during processing while also including sufficient qualities of heat resistance and injectability.

In an example embodiment, the support insulator 321 may include a crystalline thermoplastic plastic. For example, the support insulator 321 may include polyether ether ketone (PEEK). The support insulator 321 may have an increased deformation threshold temperature by heat (e.g., approximately greater than or equal to 150 □) via formation of the support insulator 321 by crystalline thermoplastic plastic, so as to include sufficient qualities of heat resistance and injectability.

In an example embodiment, the support insulator 321 may include a fiber reinforced material. For example, the support insulator 321 may be reinforced by glass fiber. Approximately 20% of the support insulator 321 may be reinforced by glass fiber and may include PEI. In another example, 30% of the support insulator 321 may be reinforced by glass fiber and may include PEEK. In another example, the support insulator 321 may be alternatively or additionally reinforced by carbon fiber.

In an example embodiment, the filler 319 may include a visible hole 341. Here, "visible" may indicate that the hole 341 is viewable from an exterior of the electronic device 301, which may allow an observer to verify the presence of the support insulator 321 through the visible hole 341. The visible hole 341 may extend from an outer surface of the filler 319 to a surface (e.g., an upper surface with reference to FIG. 3E) of the base 322. In an example embodiment, the visible hole 341 may be a substantially circular hole. In an example embodiment, the visible hole 341 may be formed at a position in the outer surface of the filler 319 corresponding to a substantially central portion of the surface of the base 322.

Hereinafter, a method of manufacturing an electronic device is described with reference to FIGS. 4A to 4G. FIGS. 4A to 4G are merely a given order to exemplarily describe operations of the method of manufacturing an electronic device, the operations of the method are not necessarily performed in the given order, and one or more operations may be omitted, added, or an order of some operations may be modified.

Figure 4A:
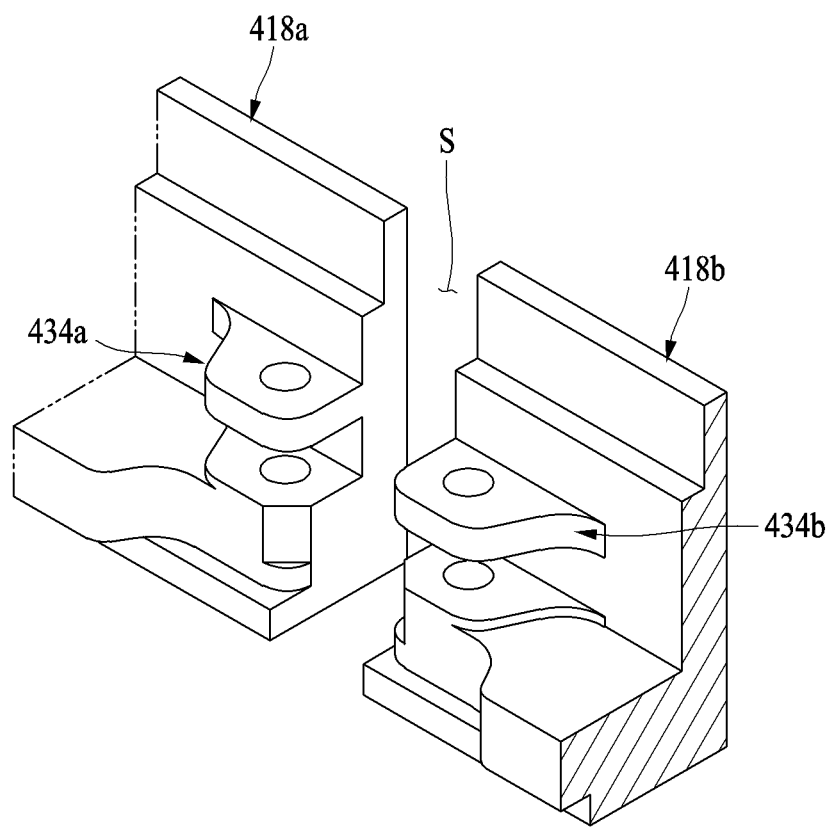
FIG. 4A is a diagram illustrating an operation of processing metal segments in a method of manufacturing an electronic device according to certain example embodiments.

Referring to FIG. 4A, the method may include an operation of processing (e.g., arranging) a first metal segment 418a (e.g., the first metal segment 318a) including a first engagement portion 434a (e.g., the first engagement portion 334a), and a second metal segment 418b (e.g., the second metal segment 318b) including a second engagement portion 434b (e.g., the second engagement portion 334b). The first metal segment 418a and the second metal segment 418b may be spaced apart from each other to define a slit S therebetween, that may prevent electrically connection to each other. In an example embodiment, an operation of processing the first metal segment 418a and the second metal segment 418b may be performed in a layout determined by computer numerical control (CNC).

Figure 4B:
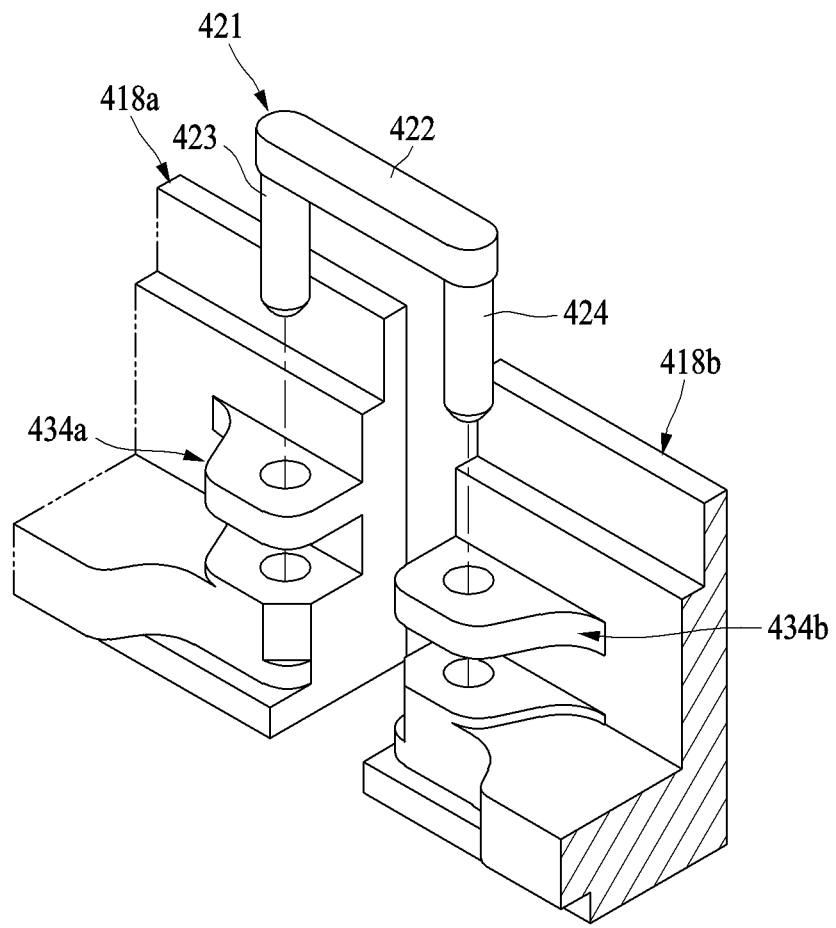
FIGS. 4B and 4C are diagrams illustrating an operation of engaging metal segments in the method of manufacturing an electronic device according to certain example embodiments.
Figure 4C:
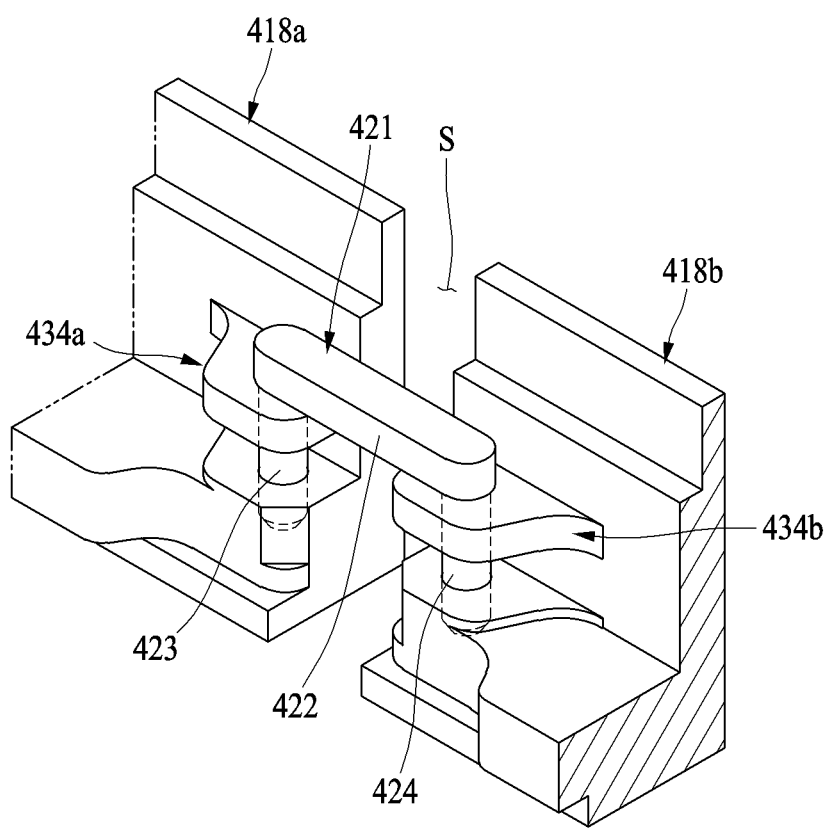

Referring to FIGS. 4B and 4C, the method may include injecting (e.g., inserting) a support insulator 421 including a base 422 (e.g., the base 322), a first link 423 (e.g., the first link 323), and a second link 424 (e.g., the second link 324). The method may include an operation of engaging the first link 423 of the support insulator 421 with the first engagement portion 434a of the first metal segment 418a, and engaging the second link 424 of the support insulator 421 with the second engagement portion 434b of the second metal segment 418b, while substantially maintaining the gap defined by the slit S between the first metal segment 418a and the second metal segment 418b.

Figure 4D:
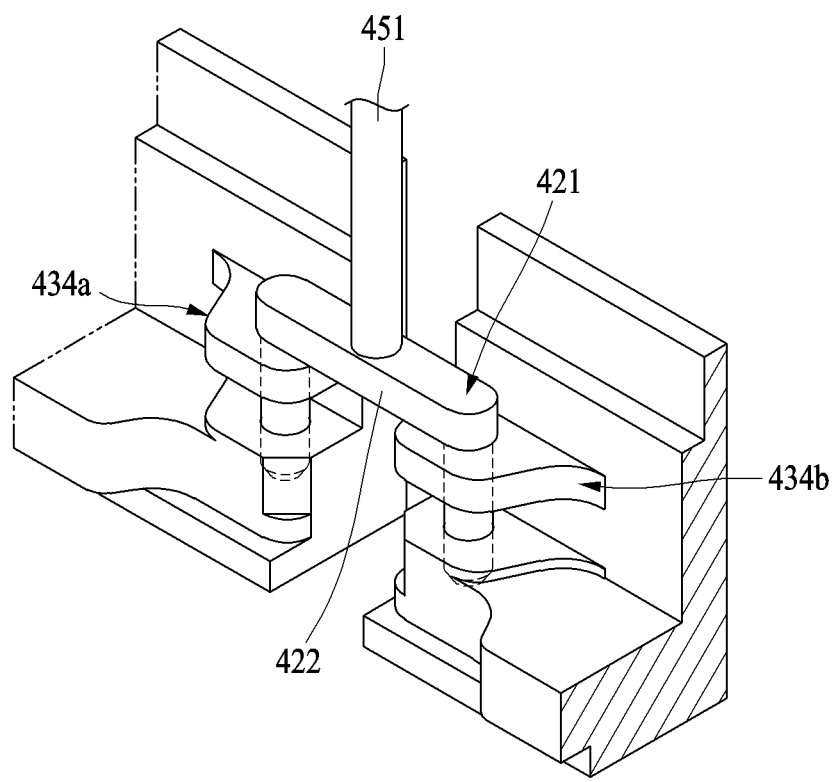
FIG. 4D is a diagram illustrating an operation of supporting a support insulator before filling a filler in the method of manufacturing an electronic device according to certain example embodiments.

Referring to FIG. 4D, the method may include applying a force to the base 422 using a metal support 451, such that the support insulator 421 remains supported while maintaining engagement by the first and second engagement portions 434a and 434b. The metal support 451 may include a substantially circular cross-section.

Figure 4E:
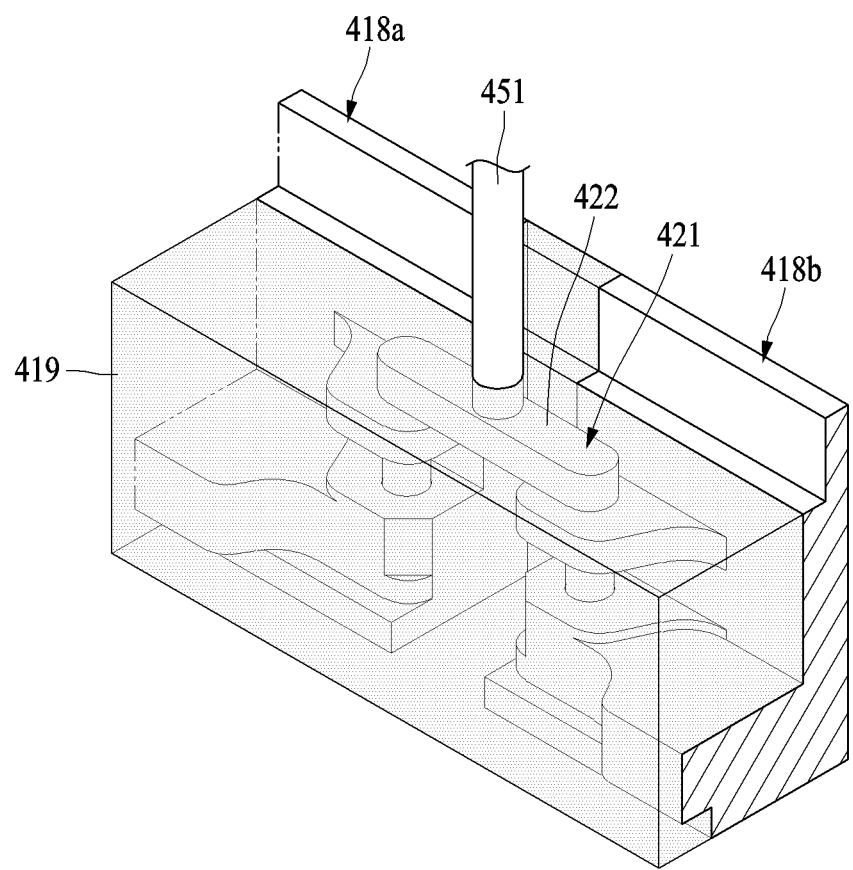
FIG. 4E is a diagram illustrating an operation of filling the filler while supporting the support insulator in the method of manufacturing an electronic device according to certain example embodiments.

Referring to FIG. 4E, the method may include an operation of filling a space (e.g., the slit S) between the first metal segment 418*a* and the second metal segment 418*b*, with an injection material(s) (e.g., filler 419), enclosing the support insulator 421, except for a portion covered by the metal support 451, while maintaining an application of force on the base 422 using the metal support 451. The method may include an operation of waiting until the filled injection material(s) forms (e.g., cures) as the filler 419 in a desired shape.

Figure 4F:
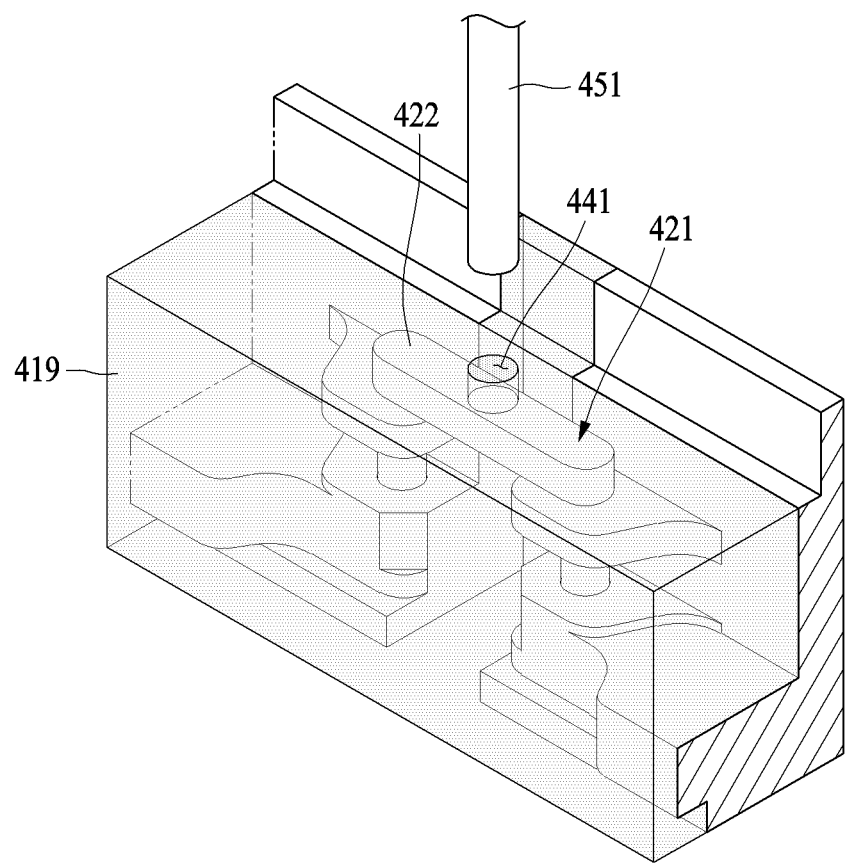
FIGS. 4F and 4G are diagrams illustrating an operation of releasing supporting by the support insulator after the filler is filled in the method of manufacturing an electronic device according to certain example embodiments.
Figure 4G:
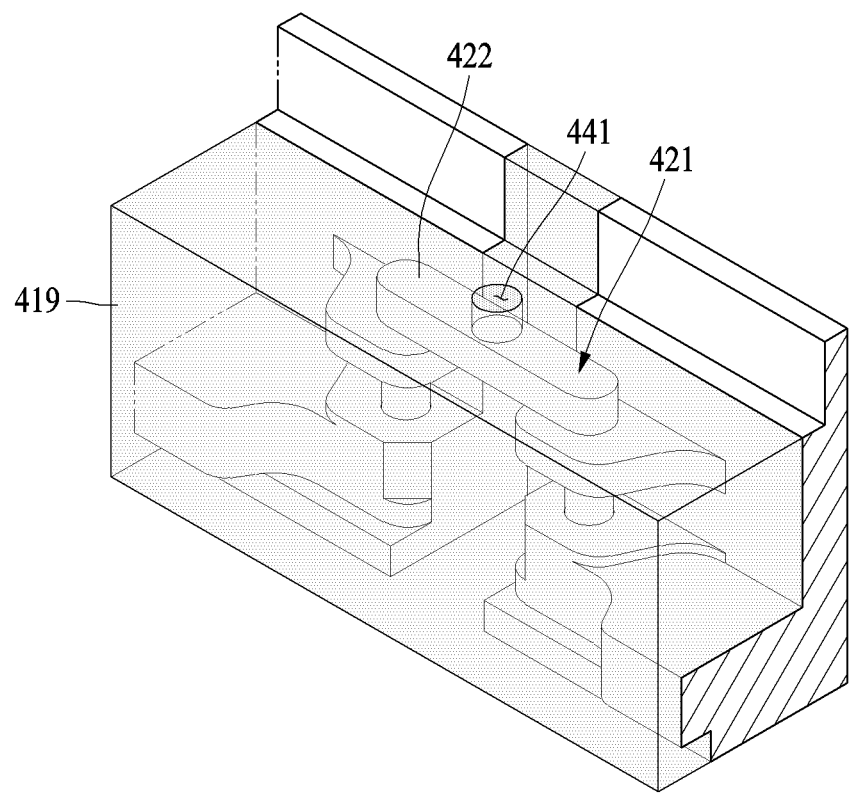

Referring to FIGS. 4F and 4G, the method may include an operation of removing the metal support 451 applying force to the base 422. When the metal support 451 is removed, a visible hole 441 (e.g., the visible hole 341) may remain, which may enable an observer to view a surface (e.g., an upper surface) of the base 422 of the support insulator 421. As depicted, the hole may be formed in a portion of an outer surface of the filler 419, where the metal support 451 was placed. A shape of the visible hole 441 may be substantially the same as a cross-sectional shape of the metal support 451.

In an example embodiment, which is not shown, the method may perform anodizing the first and second metal segments 418*a* and 418*b* to apply a color to the same, for aesthetic effect.

Figure 5:
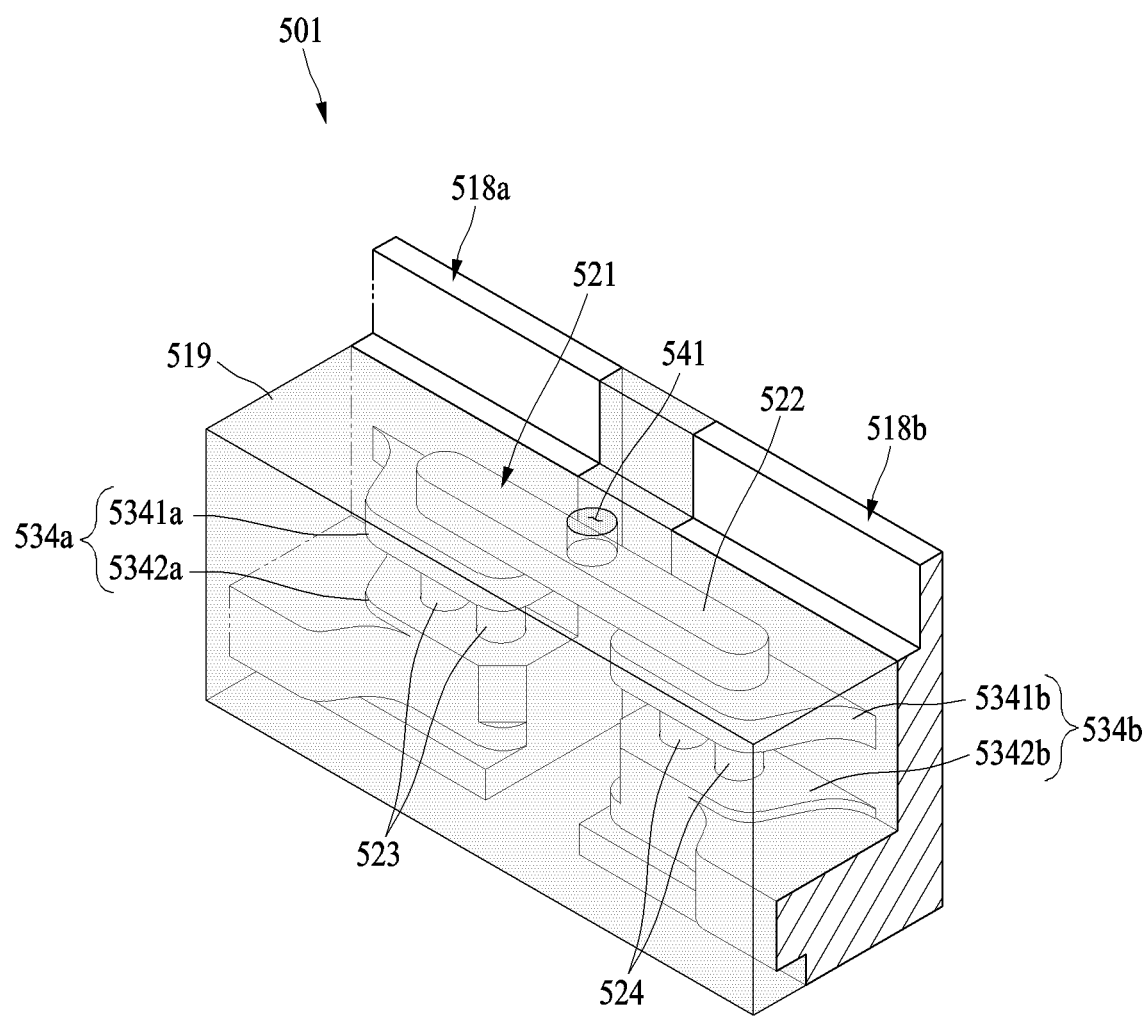
FIG. 5 is a perspective view of a portion of a structure of an electronic device according to an example embodiment.

Referring to FIG. 5, an electronic device 501 (e.g., the electronic device 301) may include a first metal segment 518*a* (e.g., the first metal segment 318*a*) including a first engagement portion 534*a* (e.g., the first engagement portion 334*a*), a second metal segment 518*b* (e.g., the second metal segment 318*b*) including a second engagement portion 534*b* (e.g., the second engagement portion 334*b*), a filler 519 (e.g., the filler 319), and a support insulator 521 (e.g., the support insulator 321). The first engagement portion 534*a* may include a plurality of first metal support layers 5341*a* and 5342*a* (e.g., the plurality of first metal support layers 3341*a* and 3342*a*), and the second engagement portion 534*b* may include second metal support layers 5341*b* and 5342*b* (e.g., the plurality of second metal support layers 3341*b* and 3342*b*). The filler 519 may include a visible hole 541 (e.g., the visible hole 341).

In an example embodiment, the support insulator 521 may include a base 522 (e.g., the base 322), a plurality of first links 523 (e.g. the first link 323) formed on a first portion of the base 522, and a plurality of second links 524 (e.g., the second link 324) formed on a second portion of the base 522. The plurality of first links 523 may be disposed so as to be spaced apart from each other at the first portion of the base 522 in a direction from the first portion of the base 522 to the second portion of the base 522, or in a reverse direction. The plurality of second links 524 may be disposed so as to be spaced apart from each other at the second portion of the base 522 in a direction from the second portion of the base 522 to the first portion of the base 522, or in a reverse direction.

In an example embodiment, the first metal support layer 5341*a* (which may include any of the plurality of first metal support layers 5341*a* and 5342*a*) may include a plurality of first holes (e.g., the first hole H1) through which the plurality of first links 523 pass, and the other first metal support layer 5342*a* may include a plurality of first grooves (e.g., the first groove G1) in which end portions of the plurality of first links 523 are seated, respectively.

In an example embodiment, the second metal support layer 5341*b* (which is any of the plurality of second metal support layers 5341*b* and 5342*b*) may include a plurality of second holes (e.g., the second hole H2) through which the plurality of second links 524 pass, and the other second metal support layer 5342*b* may include a plurality of second grooves (e.g., the second groove G2) in which end portions of the plurality of second links 524 are seated, respectively.

Figure 6:
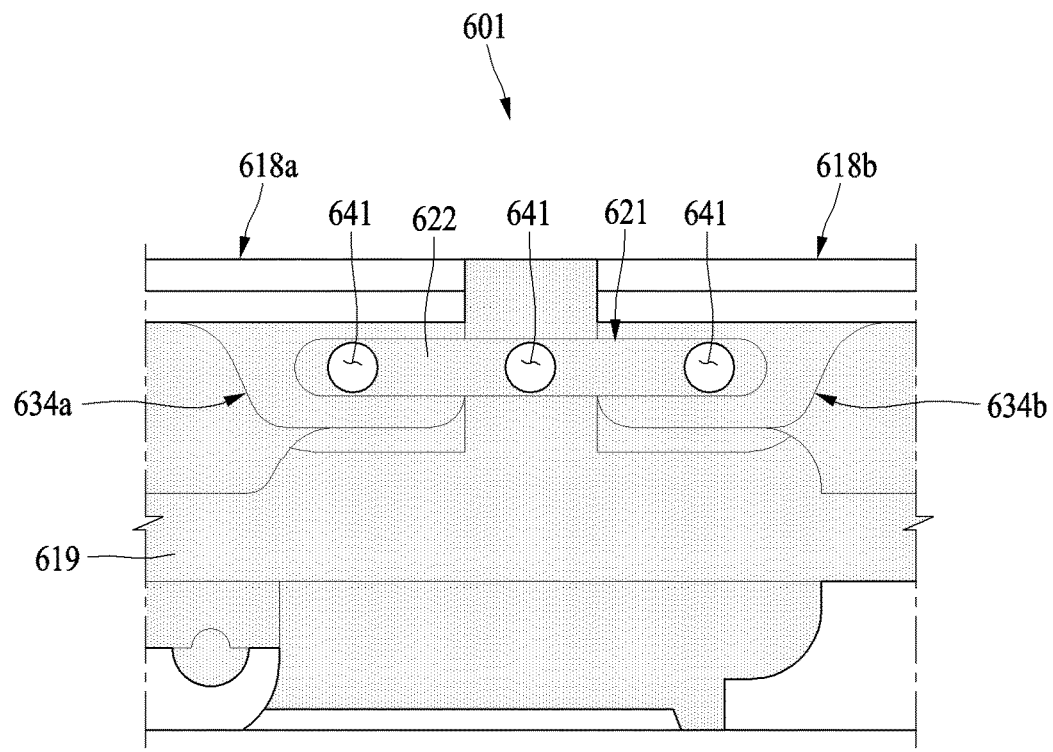
FIG. 6 is a plan view of a portion of a structure of an electronic device according to an example embodiment.

Referring to FIG. 6, an electronic device 601 (e.g., the electronic device 301) may include a first metal segment 618*a* (e.g., the first metal segment 318*a*) including a first engagement portion 634*a* (e.g., the first engagement portion 334*a*), a second metal segment 618*b* (e.g., the second metal segment 318*b*) including a second engagement portion 634*b* (e.g., the second engagement portion 334*b*), a filler 619 (e.g., the filler 319), and a support insulator 621 (e.g., the support insulator 321). The support insulator 621 may include a base 622 (e.g., the base 322), a first link (e.g., the first link 323), and a second link (e.g., the second link 324).

In an example embodiment, the filler 619 may include a plurality of visible holes 641 (e.g., the visible hole 341) through which the base 622 may be visible. The plurality of visible holes 641 may be each disposed space apart from each other along a formation direction (e.g., a horizontal direction) of the base 622. A disposition structure of the plurality of visible holes 641 may result from preventing the support insulator 621 from floating, using an injection object that applies force to the base 622 using a plurality of metal supports (e.g., the metal support 451), when forming the filler 619.

Figure 7:
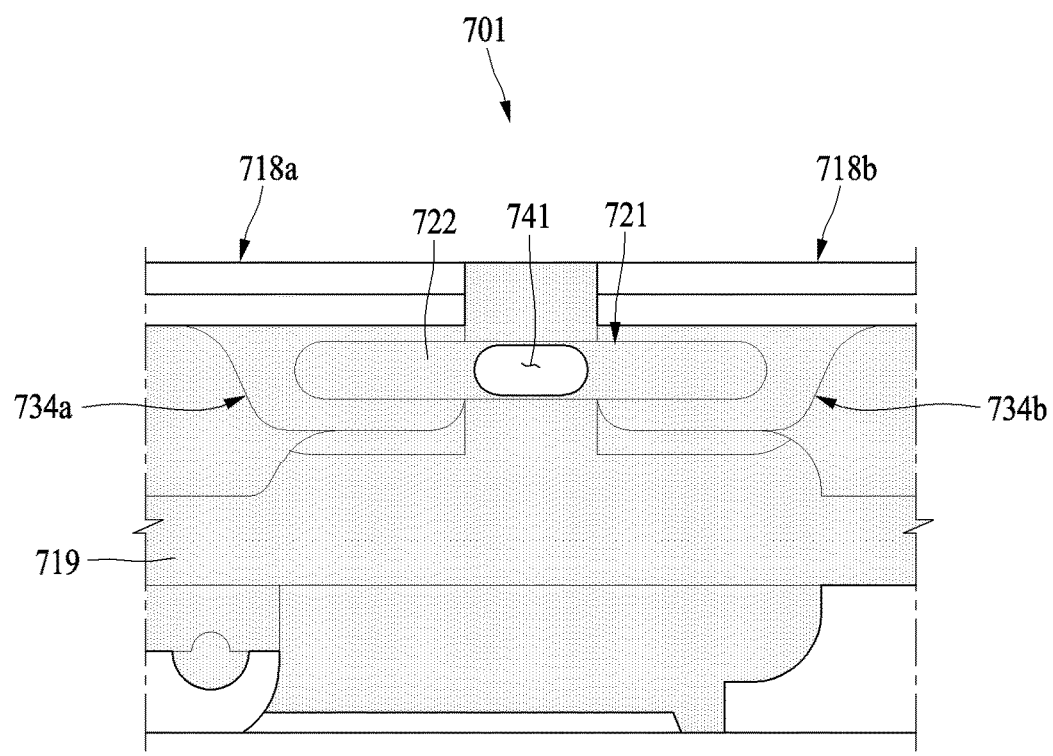
FIG. 7 is a plan view of a portion of a structure of an electronic device according to an example embodiment.

Referring to FIG. 7, an electronic device 701 (e.g., the electronic device 301) may include a first metal segment 718*a* (e.g., the first metal segment 318*a*) including a first engagement portion 734*a* (e.g., the first engagement portion 334*a*), a second metal segment 718*b* (e.g., the second metal segment 318*b*) including a second engagement portion 734*b* (e.g., the second engagement portion 334*b*), a filler 719 (e.g., the filler 319), and a support insulator 721 (e.g., the support insulator 321). The support insulator 721 may include a base 722 (e.g., the base 322), a first link (e.g., the first link 323), and a second link (e.g., the second link 324). The filler 719 may include a visible hole 741 (e.g., the visible hole 341) through which the base 722 may be visible from an exterior.

In an example embodiment, the visible hole 741 may be formed in various geometric shapes. For example, the visible hole 741 may have a substantially elliptical shape.

Figure 8:
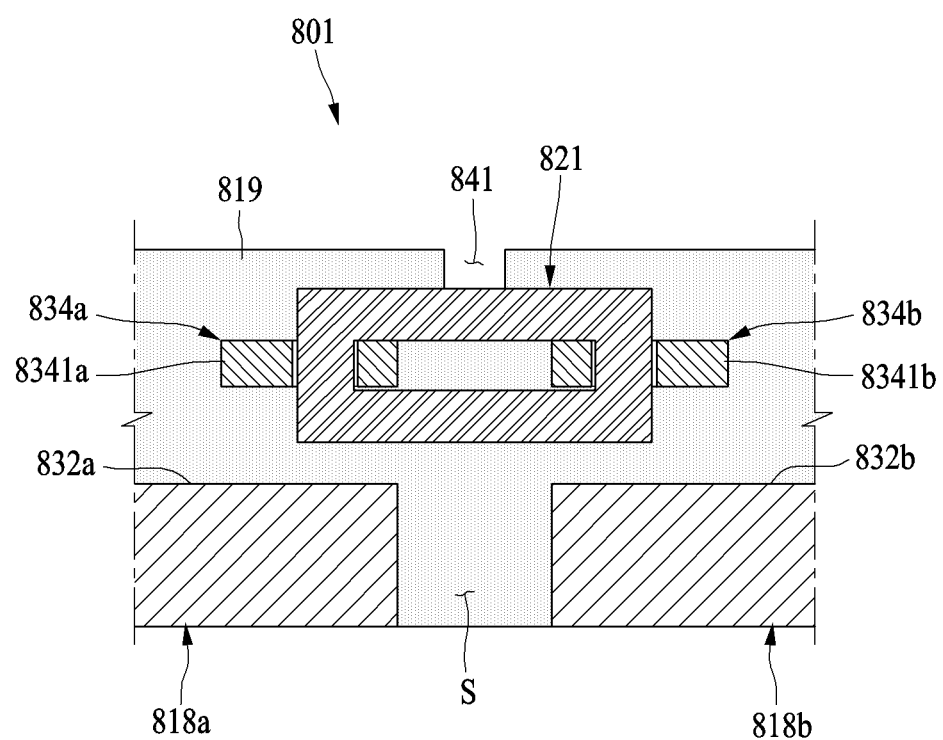
FIG. 8 is a cross-sectional view of a portion of a structure of an electronic device according to an example embodiment.

Referring to FIG. 8, an electronic device 801 (e.g., the electronic device 301) may include a first metal segment 818*a* (e.g., the first metal segment 318*a*) including a first engagement portion 834*a* (e.g., the first engagement portion 334*a*), a second metal segment 818*b* (e.g., the second metal segment 318*b*) including a second engagement portion 834*b* (e.g., the second engagement portion 334*b*), a filler 819 (e.g., the filler 319), and a support insulator 821 (e.g., the support insulator 321). The first engagement portion 834*a* may include at least one first metal support layer 8341*a* (e.g., the first metal support layer 3341*a*) including at least one first hole (e.g., the first hole H1), and the second engagement portion 834*b* may include at least one second metal support layer 8341*b* (e.g., the second metal support layer 3341*b*) including at least one second hole (e.g., the second hole H2). The filler 819 may include a visible hole 841 (e.g., the visible hole 341).

In an example embodiment, the first metal segment 818*a* may include a first sheet 832*a* (e.g., the first sheet 332*a*), which may be substantially flat. In the first sheet 832*a*, none of the engagement structures (e.g., the first metal support layer 3342*a*) of the support insulator 821 may be formed.

In an example embodiment, the second metal segment 818*b* may include a second sheet 832*b* (e.g., the second sheet 332*b*), which is substantially flat. In the second sheet 832b, none of the engagement structures (e.g., the second metal support layer 3342b) of the support insulator 821 may be formed.

In an example embodiment, the support insulator 821 may be implemented by a member extending in a lengthwise direction that passes through the first hole (e.g., the first hole H1) and the second hole (e.g., the second hole H2) and forms a substantially closed loop. For example, the length direction member may include a cable.

According to certain example embodiments, the electronic device 301 may include the first metal segment 318a including a first engagement portion 334a, the second metal segment 318b including the second engagement portion 334b and being spaced apart from the first metal segment 318a to form the slit S with the first metal segment 318a, the support insulator 321 engaging with the first and second engagement portions 334a and 334b, supporting the first and second metal segments 318a and 318b, and insulating between the first and second metal segments 318a and 318b, and the filler 319 enclosing at least a portion of the support insulator 321 and filling at least a portion of the slit.

In an example embodiment, the stiffness of the support insulator 321 may be greater than the stiffness of the filler 319.

In an example embodiment, the heat resistance of the support insulator 321 may be greater than the heat resistance of the filler 319.

In an example embodiment, the permittivity of the support insulator 321 may be substantially equal to or greater than the permittivity of the filler 319.

In an example embodiment, the support insulator 321 may include the thermoplastic plastic.

In an example embodiment, the thermoplastic plastic may be the non-crystalline thermoplastic plastic.

In an example embodiment, the support insulator 321 may further include the glass fiber.

In an example embodiment, the support insulator 321 may further include the carbon fiber.

In an example embodiment, the first engagement portion 334a may include the first metal support layer 3341a formed on a surface of the first metal segment 318a, the first metal support layer 3341a may include the first hole H1, the second engagement portion 334b may include the second metal support layer 3341b formed on a surface of the second metal segment 318b, the second metal support layer 3341b may include the second hole H2, the support insulator 321 may include the first link 323 connected to the first hole H1, the second link 324 connected to the second hole H2, and the base 322 connecting the first link 323 to the second link 324 and being supported by the first and second metal support layers 3341a and 3341b.

In an example embodiment, the first engagement portion 334a may include the first groove G1 formed on a different surface of the first metal segment 318a, the second engagement portion 334b may include the second groove G2 formed on a different surface of the second metal segment 318b, the first link 323 may include the first extension 3231 extending from the first portion of the base 322 and passing through the first hole H1, and the first receiving end 3232 accommodated in the first groove G1 and formed at the end portion of the first extension 3231, the second link 324 may include the second extension 3241 extending from the second portion, which is different from the first portion, of the base 322, and passing through the second hole H2, and the second receiving end 3242 accommodated in the second groove G2 and formed at the end portion of the second extension 3241.

In an example embodiment, the filler 319 may include the visible hole 341 formed between the outer surface of the filler 319 and the base 322.

In an example embodiment, the first engagement portion 834a may include the first metal support layer 8341a formed on a surface of the first metal segment 818a, the first metal support layer 8341a may include the first hole, the second engagement portion 834b may include the second metal support layer 8341b formed on a surface of the second metal segment 818b, the second metal support layer 8341b may include the second hole, the support insulator 821 may pass through the first hole and the second hole and may include a length direction member forming a closed loop.

In an example embodiment, the first engagement portion 534a may include the plurality of first metal support layers 5341a and 5341b formed along a surface of the first metal segment 518b, the plurality of the first metal support layers 5341a and 5342a may include the plurality of first holes respectively, the second engagement portion 534b may include the plurality of second metal support layers 5341b and 5342b formed along a surface of the second metal segment 518b, the plurality of second metal support layers 5341b and 5342b may include the plurality of second holes respectively, the support insulator 521 may include the plurality of first links 523 respectively connected to the plurality of first holes of the plurality of first metal support layers 5341a and 5342a, the second links 524 respectively connected to the plurality of second holes of the plurality of second metal support layers 5341b and 5342b, and the base 522 connecting the plurality of first links 523 to the plurality of second links 524, and being supported by the first metal support layer 5341a, which is any of the plurality of the first metal support layers 5341a and 5342a, and by the second metal support layer 5341b, which is any of the plurality of the second metal support layers 5341b and 5342b.

In an example embodiment, the filler 619 may include the plurality of visible holes 641 formed between the outer surface of the filler 619 and the base 622.

In an example embodiment, the visible hole 741 may be formed in a substantially elliptical shape.

According to certain example embodiments, the method of manufacturing the electronic device may include processing the first metal segment 418a including the first engagement portion 434a and the second metal segment 418b including the second engagement portion 434b spaced apart from the first metal segment 418a to form the slit S with the first metal segment 418a, engaging the support insulator 421 that supports the first and second metal segments 418a and 418b and insulates between the first and second metal segments 418a and 418b, with the first engagement portion 434a and the second engagement portion 434b, and forming the filler 419 by enclosing at least a portion of the support insulator 421 and filling at least a portion of the slit with the injected material.

What is claimed is:
1. An electronic device, comprising:
a first metal segment including a first engagement portion;
a second metal segment including a second engagement portion, the second metal segment spaced apart from the first metal segment so as to define a slit with the first metal segment;
a support insulator engaging the first and second engagement portions, the support insulator supporting the first and second metal segments, and providing insulation between the first and second metal segments; and a filler enclosing at least a portion of the first engagement portion and the second engagement portion, and filling at least a portion of the slit.

2. The electronic device of claim 1, wherein heat resistance of the support insulator is greater than heat resistance of the filler.

3. The electronic device of claim 1, wherein a permittivity of the support insulator is substantially equal to or greater than a permittivity of the filler.

4. The electronic device of claim 1, wherein the support insulator includes a thermoplastic plastic.

5. The electronic device of claim 4, wherein the thermoplastic plastic includes a non-crystalline thermoplastic plastic.

6. The electronic device of claim 4, wherein the support insulator further includes glass fiber.

7. The electronic device of claim 4, wherein the support insulator further includes carbon fiber.

8. The electronic device of claim 1, wherein the first engagement portion includes a first metal support layer formed on a surface of the first metal segment, and the first metal support layer defines a first hole,
wherein the second engagement portion includes a second metal support layer formed on a surface of the second metal segment, and the second metal support layer defines a second hole, and
wherein the support insulator includes:
a first link inserted into the first hole,
a second link inserted into the second hole, and
a base connecting the first link to the second link, as supported by the first and second metal support layers.

9. The electronic device of claim 8, wherein the first engagement portion includes a first groove formed in another surface of the first metal segment, and
wherein the second engagement portion includes a second groove formed in another surface of the second metal segment,
wherein the first link includes:
a first extension extending from a first portion of the base and passing through the first hole, and
a first receiving end formed on a terminal end of the first extension and disposed within the first groove, and
wherein the second link comprises:
a second extension extending from a second portion of the base different from the first portion of the base and passing through the second hole, and
a second receiving end formed on an a terminal end of the second extension and disposed within the second groove.

10. The electronic device of claim 8, wherein the filler includes a visible hole formed between an outer surface of the filler and the base.

11. The electronic device of claim 10, wherein the visible hole includes a substantially elliptical shape.

12. The electronic device of claim 8, wherein the filler includes a plurality of visible holes formed between an outer surface of the filler and the base.

13. The electronic device of claim 1, wherein the first engagement portion includes a first metal support layer formed on a surface of the first metal segment, the first metal support layer including a first hole,
wherein the second engagement portion includes a second metal support layer formed on a surface of the second metal segment, the second metal support layer including a second hole, and wherein the support insulator includes a member extending in a lengthwise direction and passing through the first and second holes so as to form a closed loop.

14. The electronic device of claim 1, wherein the first engagement portion includes a plurality of first metal support layers formed along a surface of the first metal segment, the plurality of the first metal support layers including a plurality of first holes, respectively,
wherein the second engagement portion includes a plurality of second metal support layers formed along a surface of the second metal segment, the plurality of second metal support layers including a plurality of second holes, respectively, and
wherein the support insulator comprises:
a plurality of first links respectively connected to the plurality of first holes;
a plurality of second links respectively connected to the plurality of second holes; and
a base connecting the plurality of the first links to the plurality of the second links, supported by one of the plurality of the first metal support layers and one of the plurality of the second metal support layers.

15. An electronic device, comprising:
a first metal segment including a first engagement portion;
a second metal segment including a second engagement portion, the second metal segment spaced apart from the first metal segment so as to define a slit with the first metal segment;
a support insulator engaging the first and second engagement portions, the support insulator supporting the first and second metal segments, and providing insulation between the first and second metal segments; and
a filler enclosing at least a portion of the support insulator, and filling at least a portion of the slit,
wherein a stiffness of the support insulator is greater than stiffness of the filler.

16. A method of manufacturing an electronic device, the method comprising:
arranging a first metal segment including a first engagement portion and a second metal segment including a second engagement portion,
wherein the first metal segment is spaced apart from the second metal segment so as to define a slit therebetween;
engaging a support insulator supporting the first metal segment and the second metal segment, and providing insulation between the first metal segment and the second metal segment, with the first engagement portion and the second engagement portion; and
forming a filler, including filling at least a portion of the slit with an injection material that encloses at least a portion of the support insulator,
wherein the first metal segment is connected to a front surface of the electronic device and a rear surface of the electronic device, and wherein the second metal segment is connected to the front surface of the electronic device and the rear surface of the electronic device.

17. The method of claim 16, wherein the at least the portion of the slit is filled with the filler, while the support insulator is supported using a metal support.

18. The method of claim 17, wherein forming the filler further comprises removing the metal support after the injection material fills the at least the portion of the slit.

19. The method of claim 16, further comprising:
processing at least one of the first metal segment, the second metal segment, and the filler.

20. The method of claim 16, wherein the support insulator is formed of a material including a stiffness greater than a stiffness of the filler.

\* \* \* \* \*